… … …

United States Patent [19]
Hobson et al.

[11] Patent Number: 5,912,498
[45] Date of Patent: Jun. 15, 1999

[54] ARTICLE COMPRISING AN OXIDE LAYER ON GAN

[75] Inventors: William Scott Hobson, Summit; Minghwei Hong, Watchung, both of N.J.; James Robert Lothian, Bethlehem, Pa.; Joseph Petrus Mannaerts, Summit; Fan Ren, Warren, both of N.J.

[73] Assignee: Lucent Technologies Inc., Murray Hill, N.J.

[21] Appl. No.: 08/948,874

[22] Filed: Oct. 10, 1997

[51] Int. Cl.⁶ ........................................ H01L 29/76
[52] U.S. Cl. ................................ 257/410; 257/288
[58] Field of Search ........................................... 257/288

[56] References Cited

U.S. PATENT DOCUMENTS 5,451,548  9/1995  Hunt et al. .............................. 437/225
5,550,089  8/1996  Dutta et al. ............................. 437/225

FOREIGN PATENT DOCUMENTS 49-003899  1/1974  Japan .

OTHER PUBLICATIONS

Monolithic CMOS Digital Integrated Circuits in 6H–SiC Using an Implanted P–Well Process, by S. Ryu, *IEEE Electron Device Letters*, vol. 18, No. 5, May 1997, pp. 194–196.

"Determination of the Oxygen Binding Site on GaAs (110) Using Soft–X–Ray–Photoemission Spectroscopy", by P. Pianetta et al., *Physical Review Letters*, vol. 35, No. 26, Nov. 17, 1997, pp. 1356–1359.

"Fundamental Transition in the Electronic Nature of Solids", by S. Kurtin et al., vol. 22, No. 26, *Physical Review Letters*, vol. 11, No. 26, Jun. 30, 1969, pp. 1433–1436.

US Patent Application Ser. No. 08/741,010, filed Oct. 31, 1996, US Attorney Docket No. Chen 10–73–6–14–7–19.

US Patent Application Ser. No. 08/804,782, filed Feb. 24, 1997, US Attorney Docket No. Cho 76–15–5–4–20.

US Patent Application Ser. No. 08/408,678, filed Mar. 22, 1995, US Attorney Docket No. Hong 10–7–3–3–15–41.

*Primary Examiner*—Tom Thomas
*Assistant Examiner*—Ori Nadav
*Attorney, Agent, or Firm*—Eugen Pacher

[57] ABSTRACT

A high quality oxide layer has been formed on a GaN surface by a method that involves preparation of the GaN such that the surface is essentially atomically clean and essentially atomically ordered, and that further involves exposing the surface to evaporant from a GGG (gallium gadolinium garnet) evaporation source. MOS structures comprising the GaN/oxide combination have shown low leakage current, as well as charge accumulation and depletion.

5 Claims, 3 Drawing Sheets

ARTICLE COMPRISING AN OXIDE LAYER ON GAN

FIELD OF THE INVENTION

This invention pertains to articles that comprise a metal-oxide-semiconductor (MOS) structure, and to methods of making the articles.

BACKGROUND

Today's power electronics is silicon-based. Although current Si technology can meet current requirements, anticipated requirements beyond the year 2000 for high-power electronics are so stringent that it appears unlikely that they can be met by a Si-based technology. Among the requirements are thermal stability, speed (mobility and saturation velocity), and high breakdown field.

In view of the expected failure of Si-based power electronics (e.g., diodes, thyristors, gate turn-off thyristors, MOSFETs) to meet future requirements, possible alternative technologies are being contemplated, with wide bandgap semiconductors being promising. A comparison of the physical properties and availability of the main contender semiconductors suggests that SiC (silicon carbide) and GaN (gallium nitride) are the most desirable high bandgap semiconductors for power electronics, inter alia due to their excellent breakdown and transport properties.

Before power devices can be implemented in a SiC-based or GaN-based technology, many processing problems have to be solved. Prominent among these problems is the growth of an oxide layer on the semiconductor, such that demanding interface requirements are met.

Growth of high quality oxide has been demonstrated on SiC. See, for instance, S. Ryu et al., *IEEE Electron Device Letters,* Vol. 18(5), p. 194, May 1997. However, to date it has not been possible to grow high quality oxide on GaN. Thus, it would be highly desirable to have available a technique for growing such oxide on GaN. This application discloses such a technique, as well as an article that comprises a layer of such oxide on GaN.

Glossary and Definitions

By a "high quality" oxide on a semiconductor surface we mean herein an oxide that permits modulation of the semiconductor surface charge by variation of the diode voltage, i.e., the voltage across the MOS structure.

A "Ga—Gd-oxide" (or "Gd—Ga-oxide") herein is a mixed oxide that contains Ga, Gd and oxygen, with the amount of oxygen not necessarily being the stoichiometric amount corresponding to a mixture of $Ga_2O_3$ and $Gd_2O_3$. Indeed, there are indications that the amount of oxygen is typically sub-stoichiometric.

By a "substantially atomically clean" surface we mean herein a surface having less than 1% of a monolayer (preferably less than 0.1%) impurity atom coverage. The degree of impurity atom coverage can be measured by a known technique (XPS). See, for instance, P. Pianetta et al., *Phys. Rev. Letters,* Vol. 35(20), p. 1356 (1975). The condition is typically met if conditions are such that $$\int_{t_c}^{t_m} p(t)dt$$

is at most 100 Langmuir, where p(t) is the impurity partial pressure, $t_c$ is the time of completion of impurity removal from the GaN surface, and $t_m$ is the time of completion of the first monolayer of Ga—Gd-oxide on the GaN surface. A "Langmuir" is a conventional measure of surface exposure, namely, $1\times10^{-6}$ Torr-seconds.

Herein a surface is "substantially atomically ordered" if a surface reconstruction is observed. Means for observing a surface reconstruction are conventional.

SUMMARY OF THE INVENTION

The invention is embodied in an article that comprises a semiconductor device, e.g., a diode, thyristor, or MOS field effect transistor (FET). The semiconductor device comprises an oxide layer on a major surface of a semiconductor body. Typically the device also comprises a metal layer on the oxide layer.

Significantly, the semiconductor body is a GaN body (typically a single crystal GaN body), and the oxide layer comprises is a high quality Ga—Gd-oxide layer.

The invention is also embodied in a method of making an article that comprises a semiconductor device that comprises an oxide layer on a major surface of a semiconductor body. Significantly, the semiconductor body is a GaN body, and the method comprises forming the oxide layer on a major surface of the GaN body by exposing the major surface to evaporant from a $Ga_5Gd_3O_{12}$ evaporation source, such that high quality Ga—Gd-oxide is formed. This typically requires processing of the GaN surface such that at least the relevant portion of the surface is substantially atomically clean and substantially atomically ordered, with the atomic cleanliness maintained at least until the first monolayer of Ga—Gd-oxide is formed on the GaN surface.

DETAILED DESCRIPTION

Figure 1:
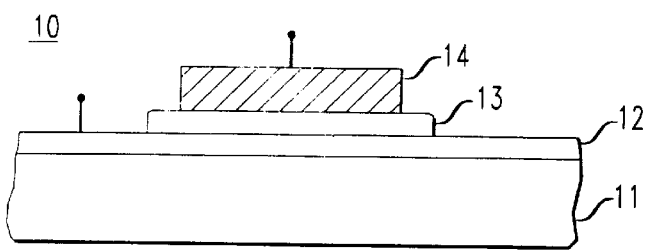
FIG. 1 schematically shows a MOS structure according to the invention.

We have discovered that a method that is similar to a recently discovered method of growing device-quality oxide on GaAs can be used to grow high-quality oxide on GaN. We consider this discovery to be unexpected in view of the significant differences in chemical and physical properties between GaAs and GaN. For instance, the former is covalently bonded and has cubic symmetry, whereas the latter is ionically bonded and has hexagonal symmetry. See, for instance, S. Kurtin et al., *Physical Review Letters,* Vol. 22 (26), p. 1433 (1969).

With regard to the method for growing oxide on GaAs see, for instance, U.S. Pat. Nos. 5,550,089 and 5,451,548, and U.S. patent application Ser. Nos. 08/408,678, 08/741, 010 and 08/804,782, all incorporated herein by reference.

Important features of the method according to the invention are:

a) providing the GaN body;
b) preparing the major surface such that at least a relevant portion of the surface is substantially atomically clean and substantially atomically ordered; and
c) forming the oxide layer by a process that comprises exposing the relevant atomically clean and ordered surface portion to evaporant from a $Ga_5Gd_3O_{12}$ evaporation source such that a first monolayer of the oxide is formed before a 1% surface coverage with impurity atoms is reached, with growth of the Ga—Gd-oxide layer continued until the desired thickness is reached.

The GaN body will generally be a single crystal body, with a major surface that typically has (0001) orientation, or is close (i.e., within about 5°) to the (0001) orientation. Although the GaN body can be a separate body (e.g., a wafer), in many cases the GaN body will be a single crystal layer on a single crystal substrate (e.g., a $Al_2O_3$ substrate). Such combinations are commercially available and known to those skilled in the art.

An important feature of the method according to the invention is preparation of the major surface of the GaN body such that at least a relevant portion of the surface is substantially atomically clean and substantially atomically ordered. This can be achieved by any appropriate technique (e.g., cleaving in UHV, exemplarily at $10^{-8}$ Torr or less). A preferred technique involves heating of the GaN body in UHV for a time sufficient to result in essentially complete desorption of native oxide and other impurities from the surface, and to result in surface reconstruction. The condition of the surface desirably is monitored in situ, e.g., by means of reflection high energy electron diffraction. The temperature of the GaN body will typically be in the range 530° C.–630° C., exemplarily 580° C., and the time at that temperature will typically be in the range 1 minute to 1 hours, exemplarily 5 minutes. The pressure in the desorption chamber will typically be $10^{-8}$ Torr or less, exemplarily $10^{-10}$ Torr.

A further important feature of the method according to the invention is in situ (i.e., without exposure to the ambient atmosphere) deposition of the oxide layer on the substantially atomically clean and ordered GaN surface. This deposition can be carried out in the same vacuum chamber as the impurity desorption.

A still further important feature of the method according to the invention is the choice of deposition technique and material. Despite efforts to use other materials, best results to date are obtained by e-beam deposition from single crystal gallium gadolinium garnet (GGG; $Ga_5Gd_3O_{12}$). However, it can not be precluded that another acceptable deposition technique and/or deposition material will be discovered later. In view of the requirement of a substantially atomically clean GaN surface, it is evident that such a technique will have to be compatible with UHV. Furthermore, the deposition material will have to be compatible with the requirement that, at $t_m$, at most 1% impurity coverage has accumulated. This suggests the need for deposition material that does not release significant quantities of impurities upon heating and melting. Single crystal GGG is such a material, as could be polycrystalline GGG, and possible other dense materials that release Ga-oxide.

Figure 5:
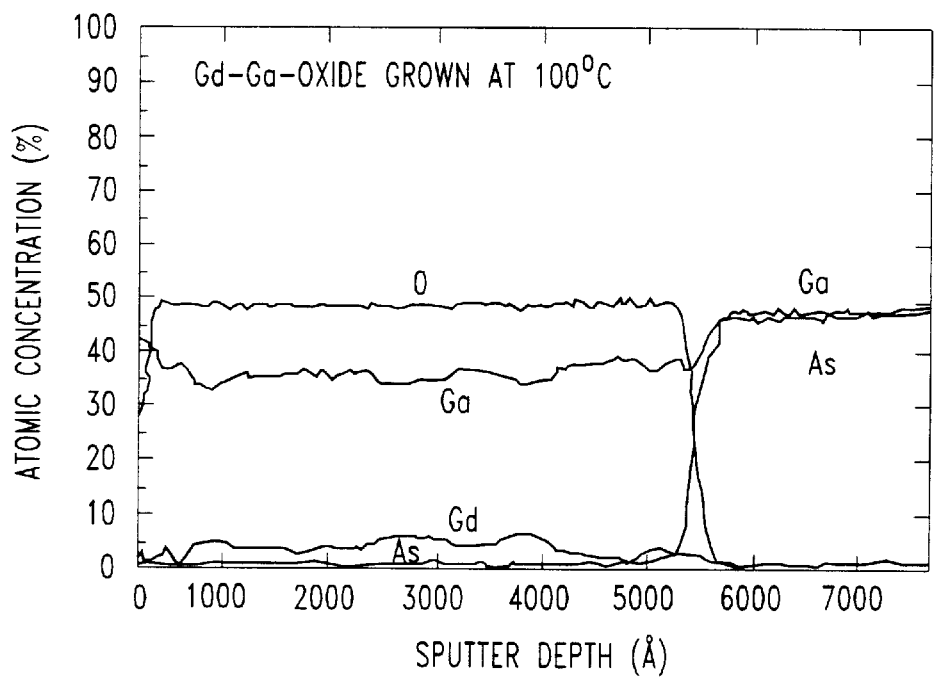
FIGS. 5 and 6 show oxide composition for two different substrate temperatures.
Figure 6:
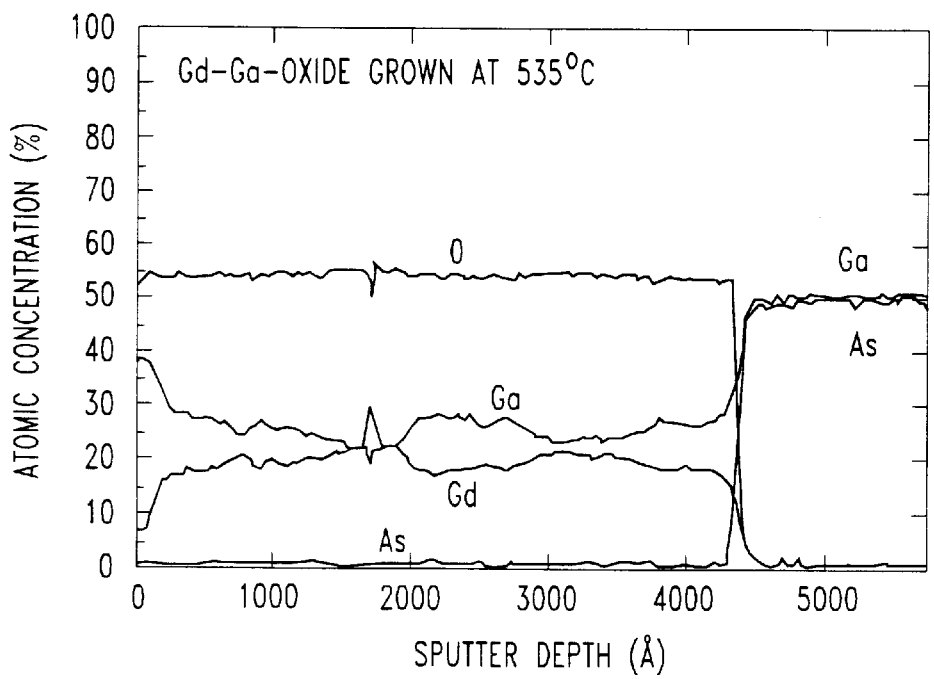

As is described in detail in the above referenced '782 patent application, the composition of the deposited Ga—Gd-oxide film depends on the substrate temperature. See FIGS. 5 and 6 herein, which show that the Ga:Gd ratio depends strongly on temperature. The substrate temperature typically is in the range 20° C.–650° C. during oxide deposition, with the range 400–600° C. being currently preferred.

Upon completion of the oxide deposition (thickness exemplarily in the range 10–100 nm), contact metal is generally deposited on the oxide, exemplarily through a shadow mask. This is conventional and does not require detailed exposition. Exemplarily the contact metal is, in sequence from the oxide, Pt/Ti/Pt/Au.

Conventional electrical measurements were carried out on exemplary MOS structures according to the invention. The measurements established that the MOS structures according to the invention met the basic requirements for a MOS device, namely, low leakage current under both forward and reverse bias, and excellent charge modulation.

FIG. 1 schematically shows an exemplary MOS structure 10 according to the invention, wherein numerals 11–14 refer, respectively, to a dielectric substrate (e.g., $Al_2O_3$), GaN layer, Ga—Gd-oxide layer, and metal contact layer. Electrical contacts are also indicated.

Figure 2:
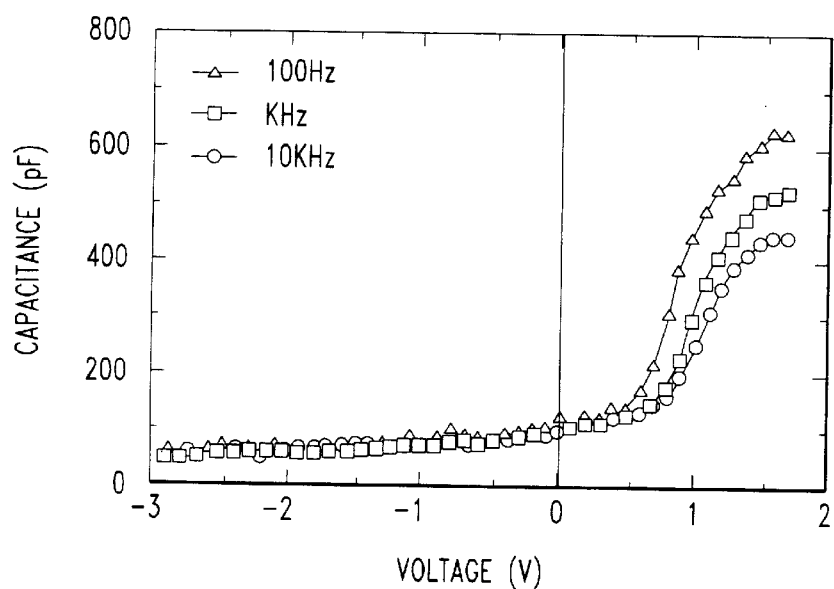
FIGS. 2 and 3 show electrical data for an exemplary MOS structure according to the invention.

FIG. 2 shows capacitance vs. voltage for an exemplary MOS structure on n-type (Si doped) GaN. The Figure shows excellent charge modulation from accumulation (positive) to depletion (negative) in response to voltage variation, at different frequencies. In distinction from typical $SiO_2$/Si MOS structures, inversion was not observed, possibly as a consequence of the ionic bonding of GaN, which can lead to very long carrier lifetime. See, for instance, Kurtin et al., op. cit.

Figure 3:
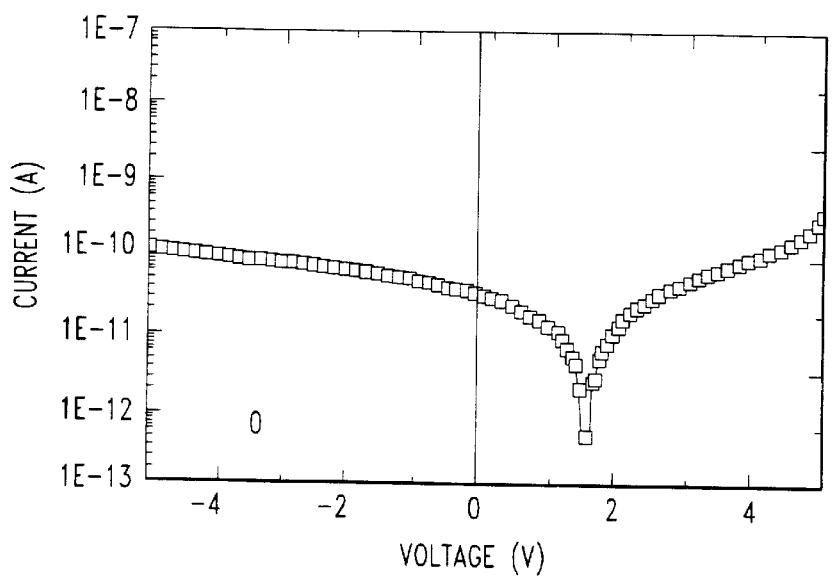

FIG. 3 shows current vs. voltage for the MOS structure of FIG. 2. The Figure shows very low leakage current under both forward and reverse bias of up to about ±4 volts, in contrast to Schottky contacts, which would have turned on around 0.7V.

Figure 4:
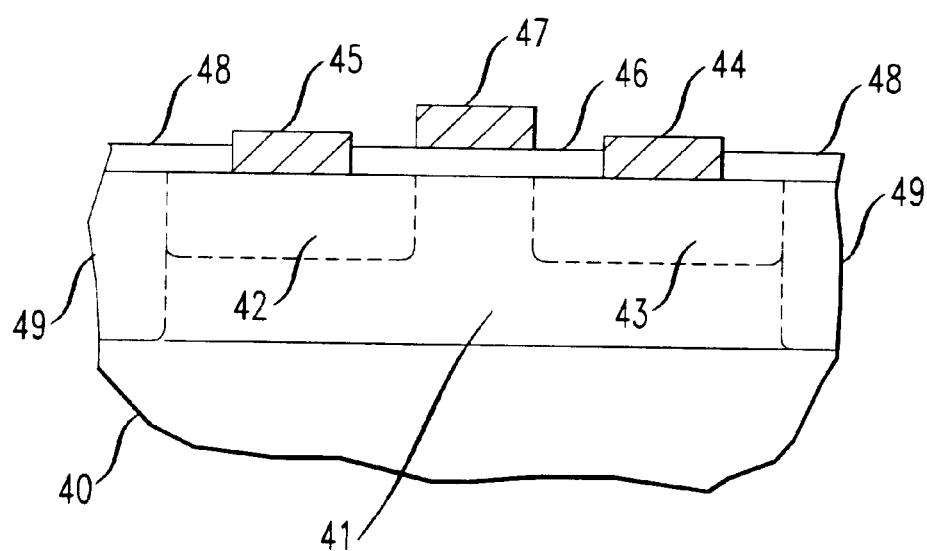
FIG. 4 schematically shows an exemplary device according to the invention, namely, a GaN-based MOSFET.

The above-described MOS structure is useful by itself as a voltage-controlled capacitor, but has greater utility in active, GaN-based electronic devices such as GaN-based MOSFETs, which are the essential elements for a GaN-based CMOS technology. Use of the MOS structure according to the invention in GaN-based active devices is anticipated. An exemplary such device is schematically depicted in FIG. 4, wherein numerals 40–45 refer, respectively, to a $Al_2O_3$ substrate, the p-type (e.g, doped with 2×17 $cm^{-3}$ Mg) GaN body, the n-type (e.g., Si implanted) source and drain regions, and the ohmic (e.g., Ti—Al/WSi/Au) drain and source contacts. Numeral 46 refers to the Ga—Gd-oxide (gate oxide), numeral 47 to the metal (e.g., Pt/Ti/Pt/Au) gate contact, and numeral 48 to the field oxide (exemplarily also Ga—Gd-oxide). Numeral 49 refers to isolation implant regions (exemplarily oxygen implanted).

EXAMPLE

A MOS structure according to the invention was prepared as follows. A 2 inch diameter (0001)-oriented sapphire substrate with 3 μm single crystal, (0001) oriented GaN thereon was provided. The sapphire/GaN body was obtained from a commercial supplier. The GaN was grown by MOCVD using triethyl gallium and ammonium. Disilane was used to dope the GaN n-type with about $10^{17}$ $cm^{-3}$ of Si.

The sapphire/GaN body was mounted with indium on a molybdenum block. A small amount of In was also placed on the GaN to provide an ohmic contact to the GaN. The Mo block with the sapphire/GaN body thereon was placed into a chamber of a MBE system and heated in UHV to 580° C. for 5 minutes to desorb native oxides. Reflection high energy electron diffraction (RHEED) was used to monitor the sample surface, and indicated that the surface was substantially atomically clean and atomically ordered. The chamber was equipped with an e-beam-heated evaporator charged with a quantity of single crystal GGG (gallium-gadolinium-garnet; $Ga_5Gd_3O_{12}$).

After oxide desorption, the sample was maintained at 535° C., and the GaN surface of the sample was exposed to the evaporant from the evaporator such that a 40 nm Ga—Gd-oxide layer formed on the surface at a rate of about 0.05 nm/s. The heating and oxide deposition were carried out under vacuum conditions such that the GaN surface was substantially atomically clean (<1% of a monolayer impurity coverage) at the time of completion of the first monolayer of the Ga—Gd-oxide.

After completion of oxide deposition, a patterned metal layer (5 nm Pt/25 nm Ti/50 nm Pt/300 nm Au) was deposited on the oxide surface with an e-beam deposition system, using a shadow mask. This completed formation of an MOS structure, and was followed by conventional electrical measurements. Exemplary results are shown in FIGS. 2 and 3, and demonstrate that the MOS structure according to the invention had a high quality oxide on the GaN, and met the basic requirements for a MOS device.

The invention claimed is:

1. An article comprising a semiconductor device that comprises an oxide layer on a major surface of a semiconductor body;

CHARACTERIZED IN THAT the semiconductor body is a GaN body, and the oxide layer is a Ga—Gd-oxide layer.

2. Article according to claim 1, wherein the major surface has an orientation that is within 5° of the (0001) orientation.

3. Article according to claim 1, wherein the semiconductor device is a field effect transistor, and the Ga—Gd-oxide layer is a gate oxide layer disposed between the major surface and a metal contact layer.

4. Article according to claim 1, wherein said Ga—Gd-oxide is selected such that the semiconductor device exhibits charge depletion under an applied voltage of a first polarity, and exhibits charge accumulation under an applied voltage of a second polarity.

5. Article according to claim 4, wherein said Ga—Gd-oxide furthermore is selected such that the device exhibits a leakage current of at most 0.1 nA at 20° C. if a voltage of plus or minus 4V is applied across the Ga—Gd-oxide layer.

* * * * *